US008604560B2

(12) United States Patent
Reynes et al.

(10) Patent No.: US 8,604,560 B2
(45) Date of Patent: Dec. 10, 2013

(54) POWER MOS TRANSISTOR DEVICE (75) Inventors: Jean Michel Reynes, Pompertuzat (FR);
Beatrice Bernoux, Tournefeuille (FR);
Rene Escoffier, Mauzac (FR); Pierre Jalbaud, Segreville (FR); Ivana Deram, Colomiers (FR)

(73) Assignee: Freescale Semiconductor, Inc., Austin, TX (US)

( * ) Notice: Subject to any disclaimer, the term of this patent is extended or adjusted under 35 U.S.C. 154(b) by 193 days.

(21) Appl. No.: 13/129,516

(22) PCT Filed: Nov. 27, 2008

(86) PCT No.: PCT/IB2008/055656
§ 371 (c)(1),
(2), (4) Date: May 16, 2011

(87) PCT Pub. No.: WO2010/061245
PCT Pub. Date: Jun. 3, 2010

(65) Prior Publication Data
US 2011/0227146 A1   Sep. 22, 2011

(51) Int. Cl.
*H01L 27/088* (2006.01)
(52) U.S. Cl.
USPC ............................................................ 257/401
(58) Field of Classification Search
USPC .................. 257/341, 401, E27.024, E27.033, 257/E21.418, E29.257
See application file for complete search history.

(56) References Cited

U.S. PATENT DOCUMENTS

| 7,432,145 | B2 | 10/2008 | Reynes et al. |
| 7,667,265 | B2 | 2/2010 | Wang et al. |
| 2005/0017694 | A1 | 1/2005 | Masson et al. |
| 2006/0145252 | A1 | 7/2006 | Reynes et al. |
| 2007/0176231 | A1 | 8/2007 | Wang et al. |

FOREIGN PATENT DOCUMENTS

| DE | 3540433 | A1 | 5/1986 |
| EP | 1093168 | A | 4/2001 |
| EP | 1909326 | A | 4/2008 |
| JP | 61080860 | A | 4/1986 |
| JP | 62235785 | A | 10/1987 |
| WO | 03/107432 | A | 12/2003 |
| WO | 2010/061244 | A1 | 6/2010 |

OTHER PUBLICATIONS

Non-Final Office Action mailed Aug. 7, 2012 for U.S. Appl. No. 13/129,505, 8 pages.
International Search Report and Written Opinion correlating to PCT/IB2008/055656 dated Jun. 23, 2009.

*Primary Examiner* — N Drew Richards
*Assistant Examiner* — Yu-Hsi D Sun (57) ABSTRACT

A transistor power switch device comprising a semiconductor body presenting opposite first and second faces, an array of vertical field-effect transistor elements for carrying current between the first and second faces is provided. The array of transistor elements comprises at the first face an array of source regions of a first semiconductor type, at least one body region of a second semiconductor type opposite to the first type interposed between the source regions and the second face, at least one control electrode for switchably controlling flow of the current through the second transistor region, and a conductive layer contacting the source regions and insulated from the control electrode by at least one insulating layer.

20 Claims, 6 Drawing Sheets

POWER MOS TRANSISTOR DEVICE

FIELD OF THE INVENTION

This invention relates to a transistor power switch device.

BACKGROUND OF THE INVENTION

US patent application publication US 2006-0145252 describes a transistor power switch device comprising an array of vertical insulated gate 'MOSFET's. The operating characteristics of the transistor power switch device are basically very satisfactory, for example in terms of ON resistance and stand-off voltage. Like other transistor power switch devices it is subject to avalanche breakdown in certain circumstances, however.

Avalanche breakdown is a phenomenon that can occur in both insulating and semiconducting materials. It is a form of electric current multiplication that can allow very large currents to flow within materials which are otherwise good insulators when the electric field in the material is great enough to accelerate free electrons to the point that, when the electrons strike atoms in the material, they can knock other electrons free. The number of free electrons is thus increased rapidly as newly generated particles become part of the process. This phenomenon can pose an upper limit on operating voltages since the associated electric fields can induce the electric current multiplication and cause excessive (if not unlimited) current flow and destruction of the device.

Avalanche breakdown of a transistor power switch is liable to be caused by unclamped inductive switching ('UIS'). Power transistors such as metal-oxide-silicon field-effect power transistors ('power MOSFET's) inherently have extremely fast switching speeds. The fast switching speeds can lead to device stress not normally encountered in slower switching circuits. In fact, switching speeds may be so fast that at device turn-off, a small parasitic inductance in the circuit can lead to significant over-voltage transients. If the resulting voltage transient is large enough, the switching transistor may be forced into avalanche, such as drain-to-source avalanche in the case of a MOSFET. Transistors may be required to withstand large numbers of repetitive avalanche breakdown occurrences without failure.

US patent application publication 20070176231 A1 describes a MOSFET transistor power switch device in which some of the transistor cells have different mesa (regions between trench gates) sizes. A heavy body etch is utilized in larger transistor cells to reduce the pinched-base resistance. This etch removes silicon in the mesa region, which is then replaced with lower-impedance aluminum. A number of smaller transistor cells that do not receive this etch are used to increase device current capacity. Avalanche current is directed to the larger, lower pinched base cells by ensuring these cells have a lower BVDSS breakdown voltage, giving a measure of avalanche protection to the smaller cells.

SUMMARY OF THE INVENTION

The present invention provides a transistor power switch device and power switch apparatus as described in the accompanying claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF THE PREFERRED EMBODIMENTS

Details of the present invention will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

Figure 1:
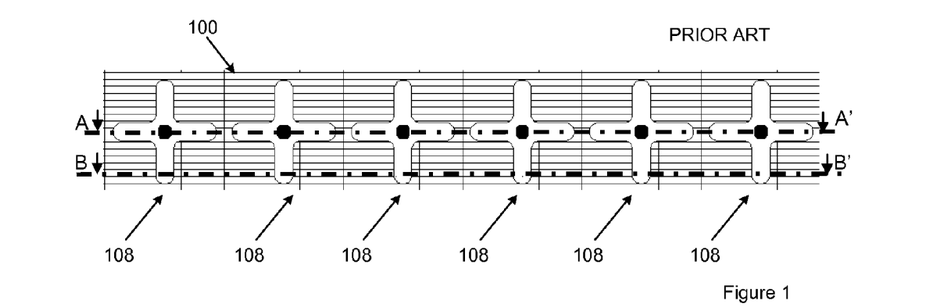
FIG. 1 shows a plan view of a part of the known transistor power switch device of U.S. patent application Ser. No. 10/518,158.
Figure 2:
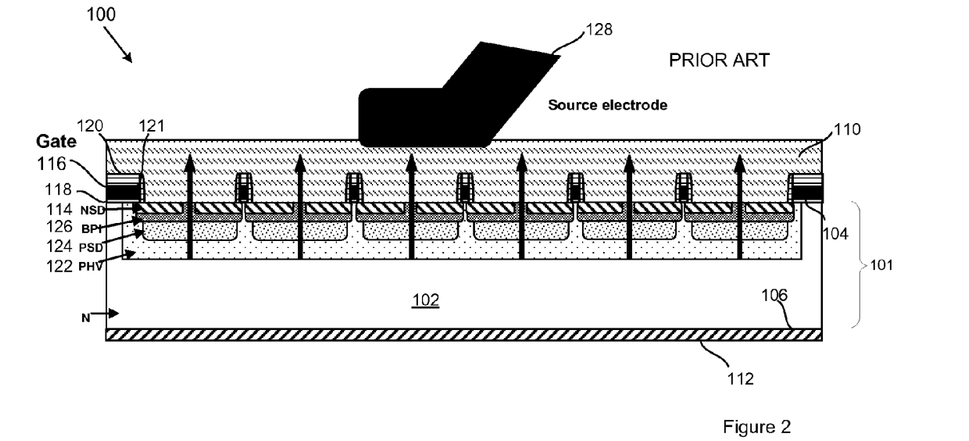
FIG. 2 shows a section of the device of FIG. 1 taken along the line A-A' of FIG. 1.
Figure 3:
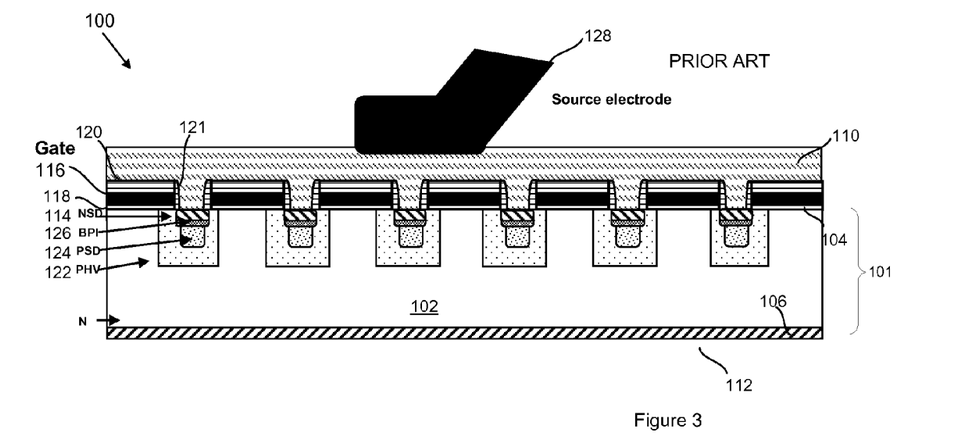
FIG. 3 shows a section of the device of FIG. 1 taken along the line B-B' of FIG. 1.

FIGS. 1 to 3 show a transistor power switch device 100 of the kind described in US patent application publication US 2006-0145252, comprising an array of base cells each comprising vertical insulated gate metal-oxide-silicon field-effect transistors ('MOSFET's) 108. A device of this kind is made with a high cell density, having several hundred-thousand or even several million cells per square centimeter of active semiconductor substrate, so as to reduce the on-state resistance, while avoiding comparable deterioration of the breakdown and unclamped inductive switching ('UIS') voltages. It will be appreciated that the drawings only show a very small part of the total number of cells and are not to scale.

The transistor power switch device 100 is an n-type device, although p-type devices are also possible. The transistor power switch device 100 comprises a semiconductor body formed from a substrate 101 of a first semiconductor type, in this example n-type, presenting opposite first and second faces 104 and 106. The transistor power switch device 100 further comprises an array of vertical transistor elements 108 which, in operation, carries current between said first and second faces 104,106. A drain electrode 112 contacts at the second face 106 an n-type drain region 102 formed in the substrate 101 which is shared by the transistor elements 108 and a source electrode 110 deposited on the first face 104 contacts the separate n-type source dopant regions 114 of the vertical transistor elements 108.

The transistor elements 108 of the array comprise at the first face 104 an array of first current carrying transistor regions 114 of a first semiconductor type, in this example n-type source dopant regions, and at least one second current carrying transistor region of a second semiconductor type opposite to the first type, in this example a p-type region, interposed between the first semiconductor source regions and the second face 106. The second region in the substrate 101 comprises a lightly doped p-type high voltage ('PHV') body or well, region 122 and a more heavily doped p-type doped ('PSD') region 124 within the PHV region 122, together with boron protection implant ('BPI') regions 126 interposed between the PSD regions 124 and the source regions 114. While the MOSFET base cells 108 may comprise second, body, regions which are separate from each other, in this example, the body regions merge together between and underneath the first, source regions 114 to form a single body region 122.

The array of vertical MOSFET base cells 108 also comprises a gate electrode 116 for switchably controlling flow of said current in the body region 122. Again, although an array of connected gate electrodes can be provided, in this example the gate electrodes are elements of a single gate electrode layer. The electrodes are not necessarily metallic but may be made of other conductive materials, such as polysilicon, for example. The drain region 102 of the substrate, the p regions 122,124,126 and the source regions 114 emerge at the face 104 of the substrate. The gate electrode 116 is insulated from the face 104 by an insulating layer 118 and the gate electrode 116 is insulated from the source electrode 110 by an insulating layer 120 with insulating spacers 121 insulating the edges of the gate electrode 116. Hereafter the block consisting of the layers 118,116,120 is referred to as the "gate stack".

Various suitable manufacturing methods are available to produce the transistor power switch device 100. US patent application publication US 2006-0145252 describes a method of making a transistor power switch device comprising an array of vertical insulated gate 'MOSFET's which can be adapted to manufacture a device in accordance with the present invention.

The transistor power switch device 100 of US patent application publication US 2006-0145252 can provide a robust UIS immunity especially because the body regions are merged to provide a single PHV body region 122. However, when increasing the avalanche current through the cross-shaped branches of the field-effect transistors, a parasitic bipolar npn transistor can be activated.

Figure 4:
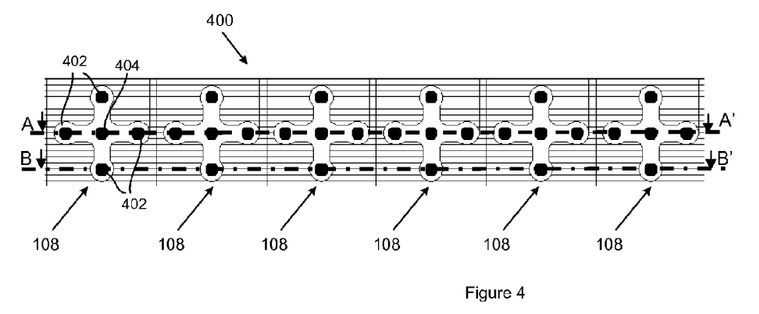
FIG. 4 shows a plan view of part of an example of a transistor power switch device in accordance with an embodiment of the present invention.
Figure 5:
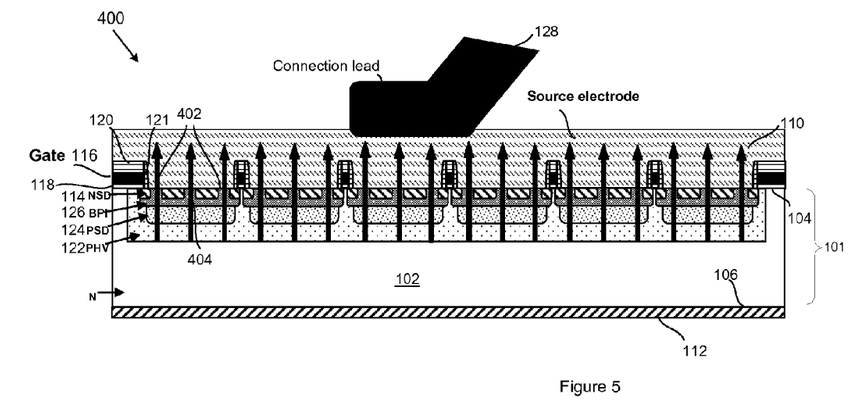
FIG. 5 shows a section of the device of FIG. 4 taken along the line A-A' of FIG. 4.
Figure 6:
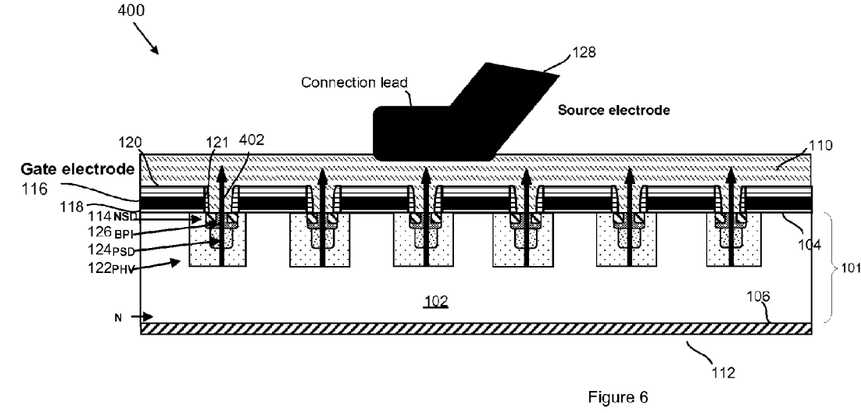
FIG. 6 shows a section of the device of FIG. 4 taken along the line B-B' of FIG. 4.

FIGS. 4 to 6 illustrate an example of a transistor power switch device 400, in accordance with an example of an embodiment of the present invention. In the transistor power switch device 400, the source region 114 of each of the vertical transistor elements 108 contacting the conductive layer 110 comprises a plurality of arms at the first face 104. The arms extend, in this example from a common origin, radially towards an arm of a source region 114 of an adjacent vertical transistor element 108 of the array, the at least one body region 122, 124, 126 extend around and under the arms of the source regions 114 and, within each of the source regions, extend upwards (through the layer of the source region 114) to contact the conductive layer 110 at the first face 104 at a contact position 402 adjacent to an end of each of the arms of the source regions 114.

In this example of an embodiment of the invention, in each of the vertical transistor elements 108 the at least one body region 122, 124, 126 also extends upwards, within each of the source regions, (through the layer of the source region) to contact the conductive layer 110 at the first face 104 at a contact position 404 central to the source region 114 of the respective vertical transistor element 108.

In more detail, the transistor power switch device 400 has similarities to the device 100 but has PSD contacts 402 provided by the PSD region 124 emerging at the face 104 within the base cells at the ends of the arms of the base cells as well as at their centres 404, in this case providing four additional PSD contacts 402 to the source electrode 110. In order to accommodate the additional PSD contacts the gate stack and source region shapes are modified at the ends of the branches as illustrated in the FIG. 4. These additional PSD contacts increase the avalanche current capability that the FETs can withstand without activating parasitic bipolar npn transistors.

In the transistor power switch device 400, the source region 114 of each of the vertical transistor elements 108 contacting the conductive layer 110 comprises a plurality of arms extending radially at the first face 104 towards an arm of a source region 114 of an adjacent vertical transistor element 108 of the array. The PHV body region 122 extends around and under the arms of the source regions 114. The PHV body region 122 is connected to the conductive layer 110 through the PSD regions 124 and the BPI regions 126, within each of the source regions, the BPI regions extend upwards, through the layers above the BPI regions, to contact the conductive layer 110 at the first face 104 at a PSD 124 contact position 402 adjacent to an end of each of the arms of the source regions 114 of the vertical transistor elements 108. The PHV body region 122 is also connected to the conductive layer 110 through the PSD regions 124 and the BPI regions 126, extending up within each of the source regions to contact the conductive layer 110 at the first face 104 at a contact position 404 central to each of the source regions 114 of the vertical transistor elements 108. The end of each of the arms of the source regions 114 is enlarged at the first face 104 around the contact position 402.

In more detail, as shown in FIG. 4, the gate stack and the source regions 114 of the base MOSFET cells 108 are formed in the shape of crosses with elongate arms and enlarged rounded ends to the arms. The arms each have a smallest width at a position remote from the ends and at the enlarged rounded ends the arm has a position with a larger width than the smallest width. More in particular, in the shown example the arm has a maximum width at a location at the enlarged rounded ends. These shapes are defined initially by forming the gate stack on the face 104 and etching the cross shapes in the material of the layers.

The second, body or well, region in the substrate 101 comprises a lightly doped p-type high voltage ('PHV') body region 122 and an array of more heavily doped p-type doped ('PSD') regions 124 within the PHV body region 122. The PHV region is formed, for example by diffusing dopant into the substrate from the face 104 after forming the gate layers 116, 118 and 120, using the gate stack as a mask to auto-align separate PHV regions of the base cells with the openings in the gate stack and then causing the dopant to spread a controlled distance vertically and laterally in the substrate so that the separate PHV regions of the base cells merge together between cells to form a continuous PHV body region 122. Before diffusion of the n-type source regions 114, p-type dopant is blanket implanted in the openings in the gate stack at positions aligned with the future source regions 114 to form boron protection implant body regions ('BPI') 126 which will present a layer under the face of the source regions 114, the BPI regions emerging at the face 104 within the ends and centre of the source regions 114 of each base cell to prevent the punch through effect at the end of the arms.

The source regions 114 are formed after forming the merged PHV region. The source regions 114 may be formed by photo-masking circular PSD contact areas 402 in the enlarged ends and in a circular PSD contact area 404 in the centre of each of the cross-shaped gate layer openings of the base cells at the face 104 and implanting and diffusing n-type dopant into the substrate from the face 104 in the openings in the gate stack except in the circular PSD contact areas 402 and 404. Then the PSD body contact regions 124 are formed by implantation. The implanted n-type and p-type dopants are simultaneously activated by annealing.

In the example of FIGS. 4-6, the source electrode 110 covers the array of MOSFET base cells 108 continuously, apart from an area for contact to the gate electrode 116, and makes electrical contact, through the openings in the gate stack 116-120, with the source regions 114 and also with the PHV region 124 through the BPI regions 126 at the contacts 402 and 404 and through the PSD regions 124 to ensure that there is no bias voltage to trigger the parasitic source-body-drain bipolar junction transistor structure even at the ends of the arms of the cross-shaped base cells. The gate electrode 116 overlaps the PHV body region 124 at the face 104 so that, in operation, a positive voltage applied to it relative to the source electrode 110 will create an inversion layer in the body region 122 forming a channel in the PHV region 122 at the face 104 under the gate electrode, the channel conducting the on current of the device when a positive voltage is applied to the drain electrode 112 relative to the source electrode 114. The on current flows up from the drain electrode 112 towards the face 104 adjacent the pn junction between the drain region 102 and the PHV body region 122 and then through the channels under the gate electrode to the source regions 114 of all the FETs 108. The gate electrode may be a single layer common to all the base cells 108 or may comprise more than one layer with suitable electrical connections. A contact (not shown in FIGS. 1 to 3 or 4 to 6) to the gate electrode may be present at an edge of the device 100 or 400. A contact to the drain electrode 112 may be made through the mounting of the device 100 or 400 to its casing (not shown in FIGS. 1 to 3 or 4 to 6). An electrical connection can made to the source electrode 110 by bonding an electrical connection lead 128 to the conductive layer of the source electrode 110 at a position directly over the MOSFETs 108. In this example, the electrical connection lead 128 is a bonding wire.

In operation, in the off state, with the gate shorted to the source, the drain-source voltage reverse biases the p-n junctions between the PHV body region 122 and the drain region 102 in the substrate 101. When the voltage increases, due to UIS for example, to a value at which the p-n junctions between the PHV body regions 122 and the drain region 102 exceed a threshold value, the p-n junctions break down due to the avalanche effect, as shown by the vertical arrows in FIGS. 2, 5 and 6. The electrical connections 402 of the PHV region 122 to the source electrode 110 through the PSD and BPI regions at the ends of the arms of the source regions 114 prevent the establishment of a voltage gradient along the arms of the source regions 114 in the PHV region 122 due to leakage currents, for example. The electrical connections 404 of the PHV region 122 to the source electrode 110 at the centres of the source regions contribute further to preventing such a voltage gradient. The avalanche current capability of switch device of FIGS. 4 to 6 is increased in the off state relative to the otherwise comparable device of FIGS. 1 to 3.

However, the gate stack is interposed between the source electrode 110 and the substrate 101 and limits the area of the source electrode 110 that is intimately in contact with the substrate 101. Not only does this limitation of contact area concentrate the flow of current, increasing the local current density and localising the generation of heat due to the flow of current through the electrically resistive material of the substrate, but in addition the electrical insulation of the gate stack is also a thermal insulation, limiting the capacity of the source electrode material to extract the heat generated. The heating effect is substantial, since the current flowing through the device 400 in UIS conditions can reach several hundred Amperes for a source-drain voltage of 30 V in one example.

Figure 7:
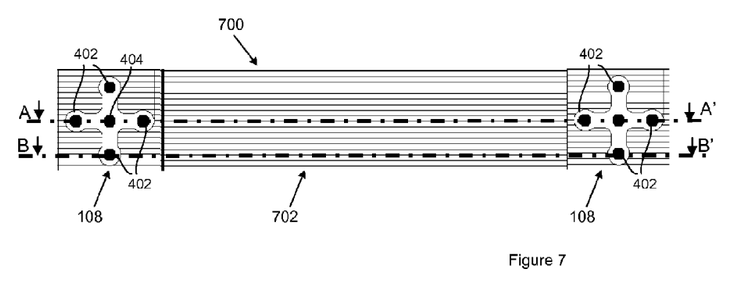
FIG. 7 shows a plan view of part of an example of a transistor power switch device in accordance with an embodiment of the present invention, with avalanche diode protection
Figure 8:
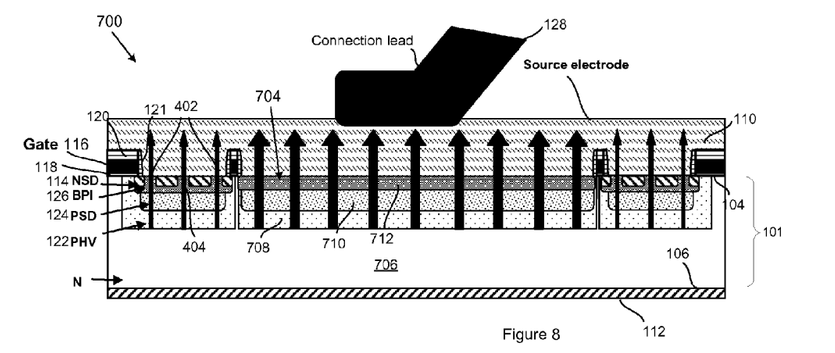
FIG. 8 shows a example of the device of FIG. 7 taken along the line A-A' of FIG. 7.
Figure 9:
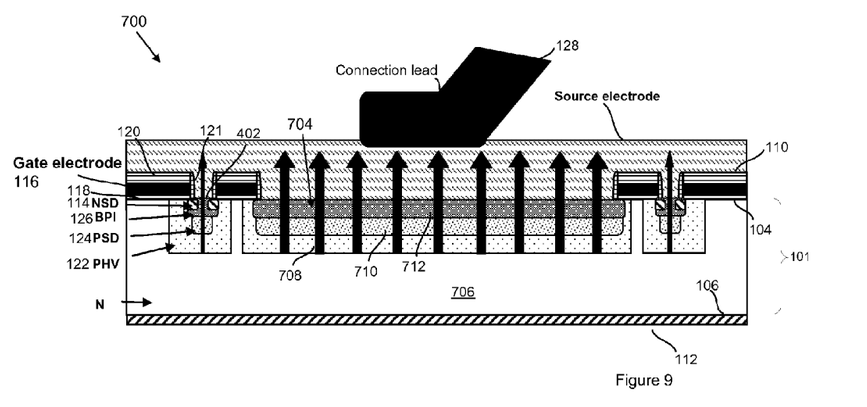
FIG. 9 shows a example of the device of FIG. 7 taken along the line B-B' of FIG. 7.

FIGS. 7 to 9 illustrate a transistor power switch device 700 in accordance with an example of an embodiment of the invention, comprising an array of vertical insulated gate metal-oxide-silicon field-effect transistors ('MOSFET's) 108 similar to the transistors of FIGS. 4 to 6. In addition, the device 700 includes a reverse biased vertical avalanche diode 702 in the semiconductor body 101 electrically in parallel with the array of transistors 108 for conducting breakdown current between the faces 104 and 106 of the device 700 in the off state of the device, the diode 702 having a first current carrying region 704 in contact with the conductive source electrode layer 110, and a second semiconductor region 706 which is electrically connected with the second face 106 and which is situated under the first current carrying region 704. The first current carrying region 704 of the repetitive avalanche diode 702 is of the same second conductivity type as the p regions 122 to 126 of the MOSFETs 108, and the second semiconductor region 706 is of the same first conductivity type as the drain regions 102 of the MOSFETs 108, in this example n-type.

In operation of the power switch device 700, in the on-state of the MOSFETs 108, the gate 116 is biased positively relative to the source electrode 110 by a voltage slightly greater than the threshold voltage Vth of the MOSFETs 108 and the drain electrode is biased positively relative to the source electrode 110, the repetitive avalanche diode 702 being reverse biased in this condition.

In normal operation of the MOSFETs 108, in the on-state the current passes first vertically up from the drain electrode 112 in the drain region 102 towards the face 104 at the perimeters of the PHV body regions 122 then laterally through the channel under the gate electrode in the PHV region 122 at the perimeters of the source regions 114 of the MOSFETs 108. In the off-state of the MOSFETs 108, with the gate electrode 116 shorted to the source electrode 110, avalanche current through the diode 702 passes first vertically through the second current carrying region 706 in the substrate 101, then through the layers of the first current carrying region 704, presenting a short current conduction path, as shown by the thick arrows in FIGS. 8 and 9, minimising heat generation. Avalanche current in the MOSFETs 108 also passes vertically, through the p regions 122, 124 and 126, but is restricted to an aggregate area at the face 104 less than the total area of the array of MOSFETs 108 by the interposed gate stack 116 to 120, as shown by the thin arrows in FIGS. 8 and 9. The conductive source electrode layer 110 covers the avalanche diode 702 as well as the MOSFETs 108 and electrical and thermal contact of the first current carrying region 704 with the conductive electrode layer 110 is continuous over substantially the whole area of the first current carrying region 704 of the diode 702 at the face 104, unimpeded by any layer of insulator material. The avalanche diode 702 is dimensioned to withstand repetitive avalanche currents and will be referred to hereinafter as a repetitive avalanche diode 702. Accordingly, current density is minimised and evacuation through the source electrode 110 of heat generated in the diode 702 by the current is maximised.

In more detail, in this example of an embodiment of the present invention, the first current carrying region 704 of the diode 702 comprises a lightly doped p-type PHV body region 708, a more heavily doped PSD region 710 within the PHV region 708 and a BPI region 712 extending from the PSD region 710 to the face 104 and contacting the source electrode 110. In this example of an embodiment of the present invention, the PHV body region 708, the PSD region 710 and the BPI region 712 are formed simultaneously with the manufacturing steps of the PHV body region 122, the PSD region 124 and the BPI region 126 of the MOSFETs 108, using appropriate masking.

Figure 10:
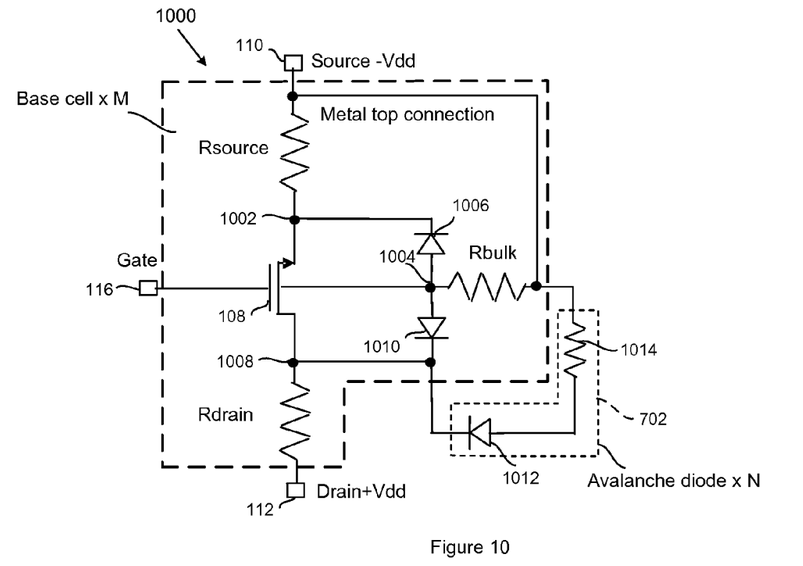
FIG. 10 shows a schematic equivalent circuit diagram of the example of FIG. 7.

FIG. 10 shows an example of the equivalent electrical circuit 1000 of the device 700, illustrating one out of a total of M MOSFET base cells and one out of a total of N repetitive avalanche diodes. A node 1002 represents the n-type side of the p-n junction between the NSD source region 114 of the MOSFET 108 and the PHV body region 122, the p-type side being represented by a node 1004 and the p-n junction by a diode 1006. A resistor Rsource represents the resistance of the material of the source region 114 in series between the node 1002 and the source electrode 110. A node 1008 represents the n-type side of the p-n junction between the n-type drain region 102 of the MOSFETs 108 and the PHV body region 122, the p-type side being represented by the node 1004 and the p-n junction by a diode 1010. A resistor Rdrain represents the resistance of the material of the drain region 102 in series between the node 1008 and the drain electrode 112. A resistor Rbulk represents the resistance of the material of the PHV, PSD and BPI p regions 122, 124 and 126 in series between the p-type sides of the p-n junctions represented by diodes 1004 and 1010 and the connection with the source electrode 110.

The repetitive avalanche diode 702 is connected electrically in parallel with the array of transistors 108 for conducting breakdown current in the off state of the device between the drain electrode 112 and the source electrode 110 at the second and first faces 106 and 104 respectively. The p-n junction between the n-type region 706 of the repetitive avalanche diode 702 and its p-type region 704 is represented by a diode 1012, the n-type side being connected to the node 1008. A resistor 1014 represents the resistance of the material of the p region 704 in series between the p-type side of the p-n junction represented by diode 1012 and the connection with the source electrode 110. The p region 704 forms a first current carrying region in contact with the conductive source electrode layer 110 and the n-type region 706 of the repetitive avalanche diode 702 forms a second semiconductor region electrically connected with the drain electrode 112 at the second face 106.

In one example of an embodiment of the invention, there is one repetitive avalanche diode 702 for an array of MOSFETs 108. Instead of bonding the electrical connection lead 128 to the source electrode 110 at a position over the array of MOSFETS 108, as in FIGS. 2 and 3 or FIGS. 5 and 6, the electrical connection lead 128 is bonded to the conductive layer of the source electrode 110 at a position over the first current carrying region 704 of the repetitive avalanche diode 702, as shown in FIGS. 8 and 9. Due to this positioning, when the voltage between the source electrode 110 and the drain electrode 112 reaches the breakdown voltage, the electrical field concentrates in the diode 702 within the substrate 101, which conducts avalanche current first, before the MOSFETs 108. The current in the diode 702 is unimpeded by insulator layers, unlike the transistors 108 so that the avalanche current in the diode is less concentrated than that in the MOSFETs of FIGS. 1 to 3 or FIGS. 5 and 6. Moreover, the absence of insulator layers interposed between the source electrode 110 and the diode 702 enables the area of the source electrode 110 contacting the diode 702 to contribute fully to conducting heat away from the diode. As shown, in this example of an embodiment of the invention, the electrical connection lead 128 comprises a wire extending away from the conductive layer of the source electrode 110 so as to dissipate heat from the diode 702.

Initially, most of the avalanche current passes through the repetitive avalanche diode 702 which has a breakdown voltage less than vertical MOSFETs 108 but as the avalanche current continues, the repetitive avalanche diode 702 increases in temperature, its breakdown voltage increases and the MOSFETs 108 participate to a greater extent in conducting avalanche current between the drain and source electrodes 112 and 110.

In the example of an embodiment of the invention described above, the area of the diode 702 and, more specifically, the area of its p region 704 at the first face 104 and contacting the source electrode conductive layer 110 is adapted to the diameter of the connection lead and the length of the bond to the contact and is several orders of magnitude greater than areas of the individual MOSFETs 108. As mentioned above, it will be appreciated that the drawings are not to scale. In one example, an individual MOSFET base cell 108 measures 50 to 100 μm$^2$ and the electrical connection lead wire 128 is approximately 250 to 380 μm diameter, whereas the diode 702 measures 500 000 μm$^2$. However, there are several orders of magnitude more MOSFETs in the array than the diode, so that the repetitive avalanche diode area represents between 10% and 30% of the total die area in this example.

Figure 11:
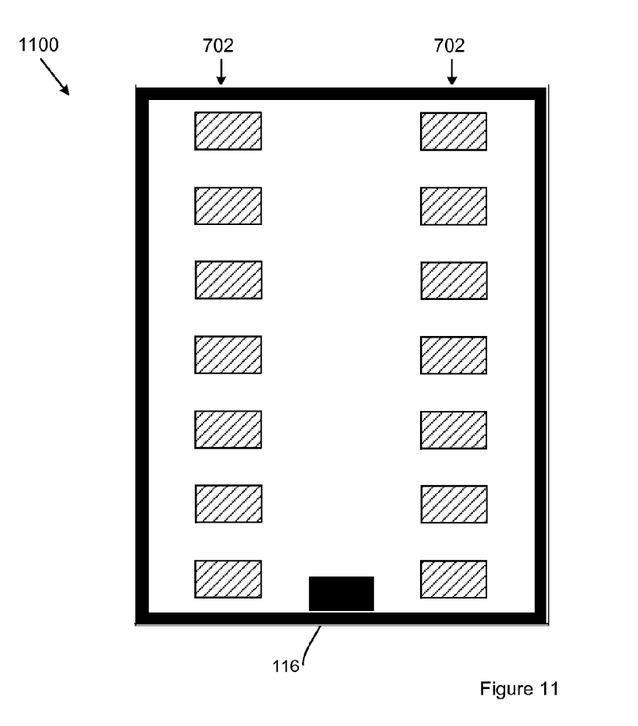
FIG. 11 shows a plan view of a greater part of the example of FIG. 7.

In another example of an embodiment of the invention, the device 700 comprises, in the semiconductor body 101 on a single die, a plurality of the reverse biased repetitive avalanche diodes 702 each of which is surrounded by one or more arrays of MOSFET cells. FIG. 11 shows an example of a device 1100 of this kind, comprising fourteen diodes 702. In another example, the device 1100 comprises ten diodes 702 and six hundred thousand MOSFET cells 108.

Figure 12:
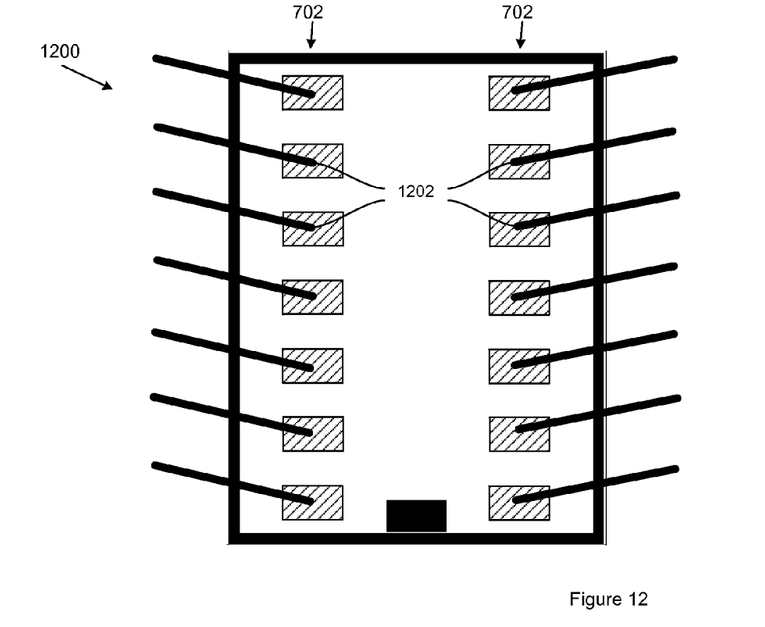
FIG. 12 shows a plan view, similar to that of FIG. 11 of part of the transistor power switch device of FIG. 7 showing a configuration of lead wires in one example of an embodiment of the invention.

In one example of an embodiment of the present invention of the kind illustrated in FIG. 11 and shown in FIG. 12, the device 1200 comprises a respective wire electrical connection lead 128 bonded to the conductive layer of the source electrode 110 at a position 1202 over the first current carrying regions 704 of each of the repetitive avalanche diodes 702. In the example of FIG. 12, a single wire electrical connection lead 128 is bonded to the conductive layer of the source electrode 110 at a position over each of the repetitive avalanche diodes.

Figure 13:
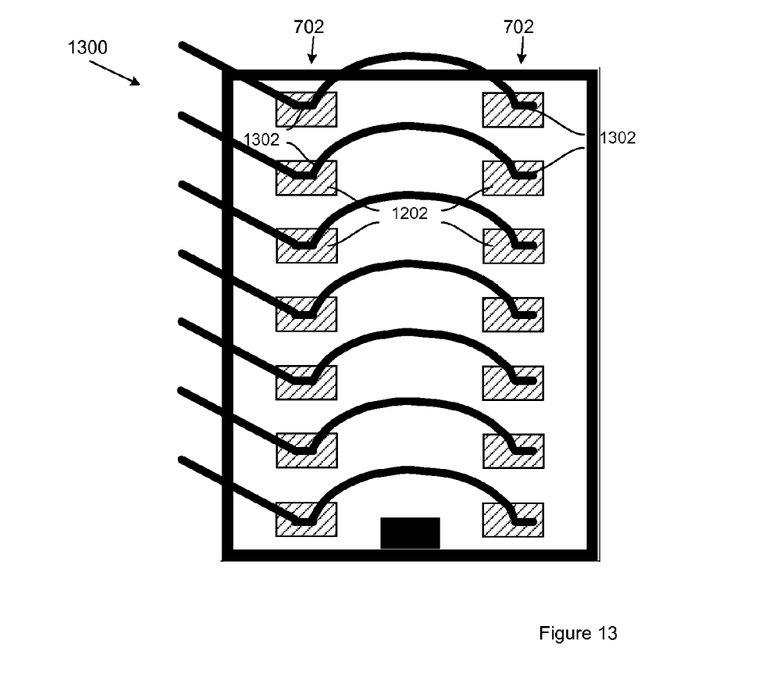
FIG. 13 shows a plan view, similar to that of FIG. 12 of part of the transistor power switch device of FIG. 7 showing a configuration of lead wires in another example of an embodiment of the invention.

In yet another example of an embodiment of the invention of the kind illustrated in FIG. 11 and shown in FIG. 13, the device 1300 comprises one or more of the wire electrical connection leads 128 bonded to the conductive layer of the source electrode 110 at a plurality of positions 1302 over the first current carrying regions of more than one of the repetitive avalanche diodes 702. In this example the same wire electrical connection lead 128 is bonded over two of the repetitive avalanche diodes 702.

In yet another example of an embodiment of the invention, electrically conductive contact bumps are grown on the source electrode 110 over the repetitive avalanche diodes 702 and then contacted by connections 128. Various electrical connection materials can be used over the conductive layer of the source electrode 110 such as aluminium ribbon, copper stud, gold or solder bumps.

Figure 14:
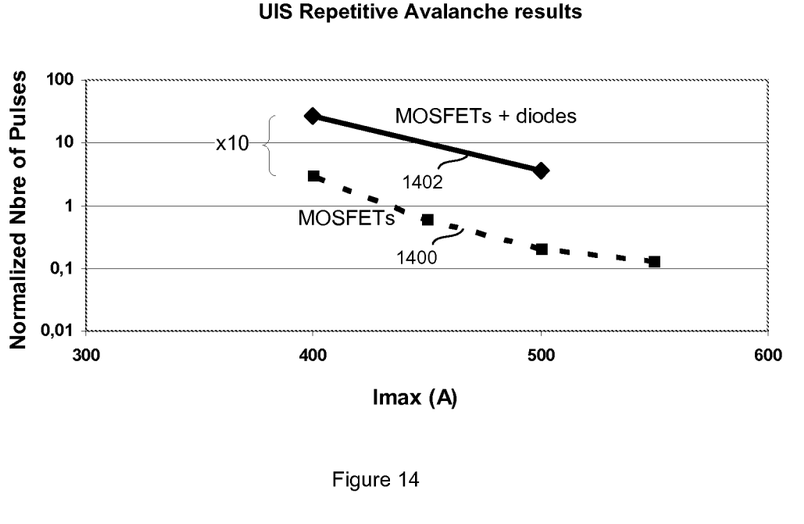
FIG. 14 shows a graph showing the robustness of a device of the kind shown in FIG. 7 to repetitive unclamped inductive switching current pulses, compared with a device of the kind shown in FIG. 4.

FIG. 14 shows a comparison of the results of UIS repetitive avalanche tests on a transistor power switch device 400 of the kind illustrated in FIGS. 4 to 6, illustrated by the dotted line 1400 with the results of a similar test on a transistor power switch device 700 of the kind illustrated in FIGS. 7 to 9 of the same die size and similar manufacturing process, illustrated by the full line 1402. An improvement of a factor of ten in the robustness of the device is obtained. It will be appreciated that using a part of the die area for the diodes 702 reduces the die area available for the MOSFETs 108, which could increase the on-resistance Rdson of the switching device 700 compared to that of the device 400. However, the improvement in UIS robustness of the device 700 compared to that of the device 400 enables its various operating characteristics to be adjusted to a different compromise, compensating the increase in Rdson.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be any type of connection suitable to transfer signals from or to the respective nodes, units or devices, for example via intermediate devices. Accordingly, unless implied or stated otherwise the connections may for example be direct connections or indirect connections.

Where the context admits, it will be understood that the semiconductor substrate described herein can be any semiconductor material or combinations of materials, such as gallium arsenide, silicon germanium, silicon-on-insulator (SOI), silicon, mono-crystalline silicon, the like, and combinations of the above.

Where the apparatus implementing the present invention is composed of electronic components and circuits known to those skilled in the art, circuit details have not been explained to any greater extent than that considered necessary for the understanding and appreciation of the underlying concepts of the present invention.

Where the context admits, the terms "front," "back," "top," "bottom," "over," "under" and the like in the description and in the claims, if any, are used for descriptive purposes and not necessarily for describing permanent relative positions or orders. It is understood that the terms so used are interchangeable under appropriate circumstances such that the embodiments of the invention described herein are, for example, capable of operation in other orientations than those illustrated or otherwise described herein.

Where the context admits, illustrated hardware elements may be circuitry located on a single integrated circuit or within a same device or may include a plurality of separate integrated circuits or separate devices interconnected with each other. Also, hardware elements in an embodiment of the invention may be replaced by software or code representations in an embodiment of the invention.

Furthermore, it will be appreciated that boundaries described and shown between the functionality of circuit elements and/or operations in an embodiment of the invention are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

In the claims, any reference signs placed between parentheses shall not be construed as limiting the claim. Where the context admits, terms such as "first" and "second" are used to distinguish arbitrarily between the elements such terms describe and these terms are not necessarily intended to indicate temporal or other prioritization of such elements.

The invention claimed is:

1. A transistor power switch device comprising:
   a semiconductor body presenting opposite first and second faces;
   an array of vertical field-effect transistor elements for carrying current between said first and second faces, wherein said array of transistor elements comprises
   at said first face an array of source regions of a first semiconductor type,
   at least one body region of a second semiconductor type opposite to said first type interposed between said source regions and said second face,
   at least one drain region of said first semiconductor type electrically connected with said second face, and
   at least one control electrode for switchably controlling flow of said current through said at least one body region, and
   a conductive layer contacting said source regions and insulated from said control electrode by at least one insulating layer; and
   wherein said source region of each of said vertical transistor elements contacting said conductive layer comprises
   a plurality of arms extending radially at said first face towards an arm of a source region of an adjacent vertical transistor element of said array,
   said at least one body region extending around and under said arms of said source regions and merging between said vertical transistor elements to form a continuous body region, and
   said at least one body region extending up within each of said source regions to contact said conductive layer at said first face at a contact position at an outer end of each of said arms of said source regions.

2. The transistor power switch device as claimed in claim 1, wherein said at least one body region also extends up within each of said source regions to contact said conductive layer at said first face at a contact position central to each of said source regions of said vertical transistor elements.

3. The transistor power switch device as claimed in claim 1, wherein said end of each of said arms of said source regions is enlarged at said first face around said contact position.

4. The transistor power switch device as claimed in claim 1, wherein said switch device also comprises:
   at least one reverse biased vertical avalanche diode in said semiconductor body electrically in parallel with said array of transistors, configured to conduct breakdown current between said first and second faces in the off state of the device, and comprising
   a first current carrying diode region of said second semiconductor type in contact with said first face, and
   with said conductive layer and a second semiconductor region of said first semiconductor type electrically connected with said second face.

5. The transistor power switch device as claimed in claim 4, and further comprising an electrical connection lead bonded to said conductive layer at a position over said first current carrying diode region.

6. The transistor power switch device as claimed in claim 5, wherein said electrical connection lead comprises a wire extending away from said conductive layer so as to dissipate heat from said diode.

7. The transistor power switch device as claimed in claim 5, wherein said electrical connection lead comprises a contact bump on top of said conductive layer so as to dissipate heat from said diode.

8. The transistor power switch device as claimed in claim 7, wherein at least one of said electrical connection leads is bonded to said conductive layer at a plurality of positions over said first current carrying diode regions of more than one of said avalanche diodes.

9. The transistor power switch device as claimed in claim 7, wherein first current carrying transistor regions of said array of vertical field-effect transistor elements each contact said conductive layer over a first area that is less than a second area over which said first current carrying diode region of said reverse biased avalanche diode contacts said conductive layer.

10. The transistor power switch device as claimed claim 7, wherein said reverse biased avalanche diode has a breakdown voltage less than said vertical transistor elements of said array.

11. The transistor power switch device as claimed in claim 5 further comprising:
in said semiconductor body, a plurality of said reverse biased avalanche diodes, wherein at least one of said electrical connection leads is bonded to said conductive layer over said first current carrying diode regions of each of said avalanche diodes.

12. The transistor power switch device as claimed in claim 5, wherein first current carrying transistor regions of said array of vertical field-effect transistor elements each contact said conductive layer over a first area that is less than a second area over which said first current carrying diode region of said reverse biased avalanche diode contacts said conductive layer.

13. The transistor power switch device as claimed claim 5, wherein said reverse biased avalanche diode has a breakdown voltage less than said vertical transistor elements of said array.

14. The transistor power switch device as claimed in claim 4, wherein first current carrying transistor regions of said array of vertical field-effect transistor elements each contact said conductive layer over a first area that is less than a second area over which said first current carrying diode region of said reverse biased avalanche diode contacts said conductive layer.

15. The transistor power switch device as claimed in claim 4, wherein said reverse biased avalanche diode has a breakdown voltage less than said vertical transistor elements of said array.

16. A transistor power switch device comprising:
a semiconductor body presenting opposite first and second faces;
an array of vertical field-effect transistor elements for carrying current between said first and second faces, wherein said array of transistor elements comprises:
at said first face an array of source regions of a first semiconductor type;
at least one body region of a second semiconductor type opposite to said first type interposed between said source regions and said second face;
at least one drain region of said first semiconductor type electrically connected with said second face;
at least one control electrode for switchably controlling flow of said current through said at least one body region; and
a conductive layer contacting said source regions and insulated from said control electrode by at least one insulating layer; and
at least one reverse biased vertical avalanche diode in said semiconductor body electrically in parallel with said array of transistors, configured to conduct breakdown current between said first and second faces in the off state of the device, and comprising:
a first current carrying diode region of said second semiconductor type in contact with said first face; and
with said conductive layer and a second semiconductor region of said first semiconductor type electrically connected with said second face;
wherein said source region of each of said vertical transistor elements contacting said conductive layer comprises:
a plurality of arms extending radially at said first face towards an arm of a source region of an adjacent vertical transistor element of said array;
said at least one body region extending around and under said arms of said source regions and merging between said vertical transistor elements to form a continuous body region; and
said at least one body region extending up within each of said source regions to contact said conductive layer at said first face at a contact position adjacent an end of each of said arms of said source regions.

17. The transistor power switch device as claimed in claim 16, wherein said at least one body region also extends up within each of said source regions to contact said conductive layer at said first face at a contact position central to each of said source regions of said vertical transistor elements.

18. The transistor power switch device as claimed in claim 16, wherein said end of each of said arms of said source regions is enlarged at said first face around said contact position.

19. The transistor power switch device as claimed in claim 16, wherein first current carrying transistor regions of said array of vertical field-effect transistor elements each contact said conductive layer over a first area that is less than a second area over which said first current carrying diode region of said reverse biased avalanche diode contacts said conductive layer.

20. The transistor power switch device as claimed in claim 16, wherein said reverse biased avalanche diode has a breakdown voltage less than said vertical transistor elements of said array.

* * * * *